(12) United States Patent
Zhou et al.

(10) Patent No.: US 12,593,719 B2
(45) Date of Patent: \*Mar. 31, 2026

(54) APPARATUS INCLUDING INTEGRATED SEGMENTS AND METHODS OF MANUFACTURING THE SAME

(71) Applicant: Micron Technology, Inc., Boise, ID (US)

(72) Inventors: Wei Zhou, Boise, ID (US); Chien Wen Huang, Taichung (TW)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/402,755

(22) Filed: Jan. 3, 2024

(65) Prior Publication Data

US 2024/0136310 A1 Apr. 25, 2024

Related U.S. Application Data

(63) Continuation of application No. 17/405,604, filed on Aug. 18, 2021, now Pat. No. 11,894,327.

(51) Int. Cl.
H01L 23/29 (2006.01)
H01L 23/00 (2006.01)
(Continued)

(52) U.S. Cl.
CPC ........... H01L 24/05 (2013.01); H01L 23/296 (2013.01); H01L 23/3171 (2013.01); H01L 23/36 (2013.01); H01L 24/03 (2013.01);

H01L 24/06 (2013.01); H01L 2224/03019 (2013.01); H01L 2224/0401 (2013.01);
(Continued)

(58) Field of Classification Search
CPC .................. H01L 24/05; H01L 23/296; H01L 2224/0401
See application file for complete search history.

(56) References Cited

U.S. PATENT DOCUMENTS 9,929,053 B2 * 3/2018 Bower ................. H01L 21/561
10,504,826 B1 * 12/2019 Fillion .................... H01L 24/20
(Continued)

FOREIGN PATENT DOCUMENTS

| JP | 2014057065 A | 3/2014 |
| TW | 201250987 A | 12/2012 |
| TW | 201523819 A | 6/2015 |

OTHER PUBLICATIONS

International Application No. PCT/US2022/035032—International Search Report and Written Opinion, mailed Oct. 21, 2022, 10 pages.
(Continued)

*Primary Examiner* — Dale E Page
*Assistant Examiner* — Wilner Jean Baptiste
(74) *Attorney, Agent, or Firm* — Dorsey & Whitney LLP

(57) ABSTRACT
Semiconductor devices including one or more interfacing segments patterned within an outer protective layer and associated systems and methods are disclosed herein. The one or more interfacing segments may provide attachment interfaces/surfaces for connection pads. The one or more interfacing segments or a portion thereof may remain uncovered or exposed and provide warpage control for the corresponding semiconductor device.

20 Claims, 5 Drawing Sheets

(51) Int. Cl.
    H01L 23/31          (2006.01)
    H01L 23/36          (2006.01)
(52) U.S. Cl.
    CPC .............. *H01L 2224/05009* (2013.01); *H01L*
            *2224/06519* (2013.01); *H01L 2924/3511*
                                    (2013.01)

(56)                 References Cited

U.S. PATENT DOCUMENTS

| | | | |
|---|---|---|---|
| 11,094,571 B2 | 8/2021 | Huska et al. | |
| 11,894,327 B2 * | 2/2024 | Zhou ..................... | H01L 23/296 |
| 2003/0205814 A1 | 11/2003 | Matsunaga et al. | |
| 2012/0286408 A1 | 11/2012 | Warren et al. | |
| 2013/0264720 A1 | 10/2013 | Chun et al. | |
| 2014/0070426 A1 | 3/2014 | Park et al. | |
| 2015/0061085 A1 | 3/2015 | Yu et al. | |
| 2015/0069579 A1 | 3/2015 | Yu et al. | |
| 2016/0099206 A1 | 4/2016 | Margalit | |
| 2020/0006183 A1 | 1/2020 | Huang et al. | |
| 2023/0054514 A1 | 2/2023 | Zhou et al. | |

OTHER PUBLICATIONS

TW Patent Application No. 111126277—Taiwanese Office Action and Search Report, dated Apr. 10, 2023, with English Translation, 21 pages.
Japanese Patent Application No. 2024-509351—Japanese Office Action and Search Report, dated Dec. 24, 2024, with English Translation, 10 pages.

* cited by examiner

800

PROVIDE A SEMICONDUCTOR SUBSTRATE 802

MANUFACTURE THE SUBSTRATE 804

FORM INTERFACING LAYER 806

PATTERN INTERFACING LAYER 808

FORM PASSIVATION LAYER 810

REMOVE COVERING PORTIONS AND/OR EXPOSE TSVS 812

ATTACH PADS 814

APPARATUS INCLUDING INTEGRATED SEGMENTS AND METHODS OF MANUFACTURING THE SAME

CROSS-REFERENCE TO RELATED APPLICATION(S)

This application is a continuation of U.S. patent application Ser. No. 17/405,604, filed Aug. 18, 2021, now U.S. Pat. No. 11,894,327, which is incorporated herein by reference in its entirety.

TECHNICAL FIELD

The present technology is directed to apparatuses, such as semiconductor devices including memory and processors, and several embodiments are directed to semiconductor devices that include connection pads.

BACKGROUND

The current trend in semiconductor fabrication is to manufacture smaller and faster devices with a higher density of components for computers, cell phones, pagers, personal digital assistants, and many other products. However, decrease in circuit size can lead to changes or weaknesses in structural integrity. For example, structures in the fabricated semiconductor device may delaminate and/or crack due to stress, temperature fluctuations, and/or mismatches in the coefficient of thermal expansion (CTE) for the corresponding materials of the structures in the device.

DETAILED DESCRIPTION

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with semiconductor devices are not shown, or are not described in detail, to avoid obscuring other aspects of the technology. In general, it should be understood that various other devices, systems, and methods in addition to those specific embodiments disclosed herein may be within the scope of the present technology.

Several embodiments of semiconductor devices, packages, and/or assemblies in accordance with the present technology can include one or more interfacing segments located under one or more pads (e.g., under-bump metallization (UBM), such as electrically active pads, electrically isolated pads, and/or thermal pads). The interfacing segments (e.g., sections of silicon nitride (SiN)) can correspond to a patterned layer and be embedded within an outer layer (e.g., a tetraethyl orthosilicate (TEOS) layer). In some embodiments, the interfacing segments may be directly coupled or connected to the corresponding pads and have widths greater than the widths of the corresponding pads. Accordingly, peripheral portions of the interfacing segments can laterally extend past one or more or all peripheral edges of the corresponding pads. The interfacing segments can further surround through-silicon vias (TSVs) that may be located under the corresponding pads. Accordingly, the connection pads may contact the interfacing segments without contacting the outer layer.

The interfacing segments can provide increased bond between the corresponding pad and the body of the overall apparatus. Moreover, the interfacing segment can include material (e.g., SiN) that is more robust and resistant to structural damages (e.g., cracks) than the outer layer (e.g., TEOS). Thus, the interfacing segment can reduce structural defects that may be caused by direct attachment between pads (e.g., UBM) and the outer layer.

Figure 1A:
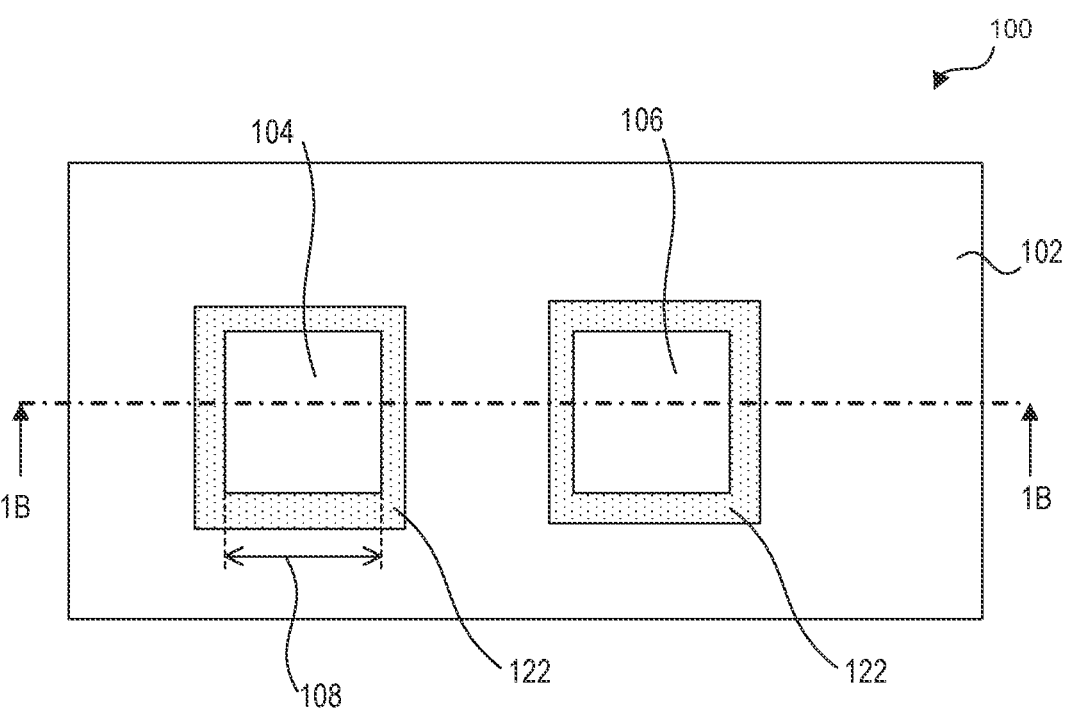
FIG. 1A is a bottom view of an apparatus in accordance with embodiments of the present technology.
Figure 1B:
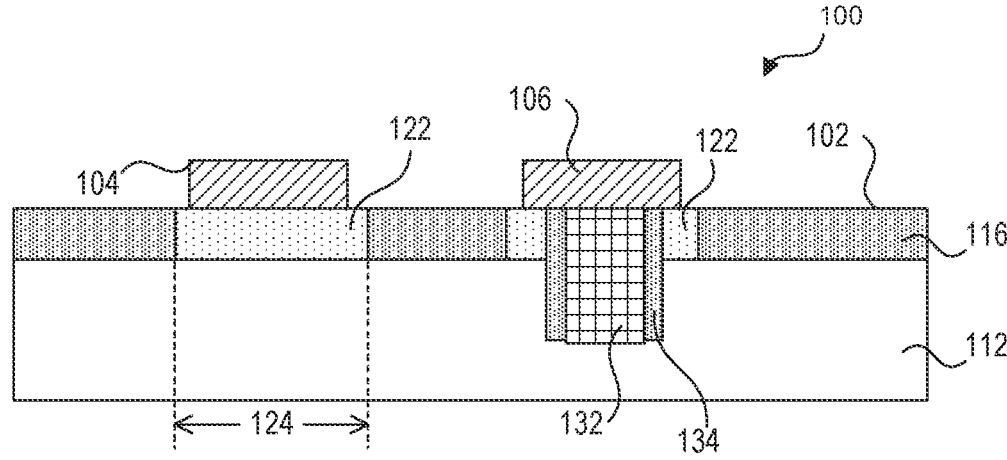
FIG. 1B is a schematic cross-sectional view of the apparatus taken along a line 1B-1B of FIG. 1A in accordance with embodiments of the present technology.

FIG. 1A is a bottom view of an apparatus 100 (e.g., a semiconductor device, such as a chip, a package, and/or an assembly), and FIG. 1B is a schematic cross-sectional view of the apparatus 100 taken along a line 1B-1B of FIG. 1A in accordance with embodiments of the technology. Referring to FIG. 1A and FIG. 1B together, the apparatus 100 can include a surface 102 (e.g., a bottom surface, an inactive surface, and/or a back surface of a semiconductor device) with a set of connection pads (e.g., UBMs). As an illustrative example, the apparatus 100 can have a thermal pad 104 and/or an electrical pad 106 exposed/mounted on the surface 102. One or more of the pads, such as the thermal pad 104, can have a pad width 108. The electrical pad 106 can be configured to provide an interface between the electric circuit of the apparatus 100 and external circuitry/devices. The thermal pad 104 can be configured to provide an interface for removing thermal energy from the apparatus 100. The thermal pad 104 may be electrically isolated from the electric circuit within the apparatus 100 and/or external circuitry.

The apparatus 100 can have a substrate 112 (e.g., a wafer-level substrate, such as a silicon substrate). The apparatus 100 can have a passivation layer 116 (e.g., a TEOS layer). The passivation layer 116 can generally overlap or cover the substrate 112 along a lateral plane. The passivation layer 116 can function as an electrical barrier and/or a physical barrier (against, e.g., moisture, debris, or the like). In some embodiments, the passivation layer 116 can function as a solder resist.

The apparatus 100 can include one or more interfacing segments 122 under the connection pads and/or adjacent to the passivation layer 116. For example, the interfacing segments 122 can be located within depressions/voids in the passivation layer 116. The passivation layer 116 and the interfacing segments 122 can have coplanar surfaces that together define the surface 102. The thermal pad 104 and/or the electrical pad 106 can be directly attached to and/or over the corresponding interfacing segments 122. In some embodiments, the interfacing segments 122 can include dielectric material, such as SiN. The interfacing segments 122 can have peripheral portions that laterally extend past/ beyond one or more or all lateral edges of the corresponding pads. Accordingly, the interfacing segments 122 can have an interfacing width 124 (e.g., a distance measured between opposing outer edges) that is greater than the pad width 108. In some embodiments, the interfacing segments 122 can have a thickness that matches a thickness of the passivation layer 116.

The apparatus 100 can include one or more TSVs 132 coupled to the electrical pads 106. The TSV 132 can include an electrically conductive structure (e.g., a copper peg, nail, spike, or the like) that extends vertically and at least partially into the substrate 112 of the apparatus 100. The TSV 132 can electrically couple the corresponding electrical pad 106 to the electric circuit within the apparatus 100. The TSV 132 may be surrounded by a via barrier 134 (e.g., a dielectric mask). For example, the via barrier 134 can be used to contain and/or shape the material forming the TSV 132.

The TSV 132 can be overlapped by and electrically coupled to the corresponding electrical pad 106. In some embodiments, the TSV 132 can extend through an opening in the passivation layer 116 and/or the interfacing segment 122. For example, a peripheral surface(s) of the TSV 132 and/or peripheral surfaces of the via barrier 134 can directly contact the interfacing segment 122 that occupies the opening in the passivation layer 116. In some embodiments, the opening can have a width or a dimension that is greater than the pad width 108.

Figure 2:
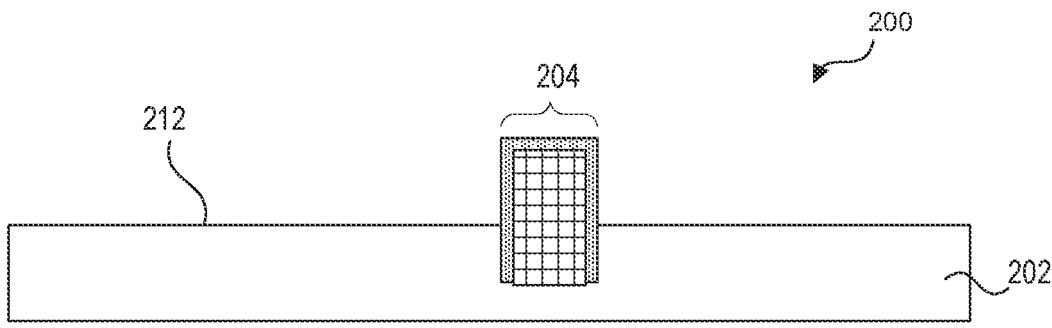
FIG. 2-FIG. 7 illustrate example phases for a manufacturing process in accordance with embodiments of the present technology.

FIG. 2-FIG. 7 illustrate example phases for a manufacturing process in accordance with embodiments of the technology. The example phases can correspond to manufacturing the apparatus 100 of FIG. 1A. FIG. 2 illustrates an intermediate structure 200 having a wafer-level substrate 202 (e.g., the substrate 112) and a TSV structure 204 (corresponding to, e.g., the TSV 132 of FIG. 1B and/or the via barrier 134 of FIG. 1B). The wafer-level substrate 202 can correspond to the substrate 112 of FIG. 1B.

The wafer-level substrate 202 can have an uncovered surface 212. The TSV structure 204 can extend below the uncovered surface 212 and partially into the wafer-level substrate 202. The intermediate structure 200 can correspond to a phase after processing of the wafer-level substrate 202. For example, the intermediate structure 200 can correspond to circuit formation (e.g., doping) on the wafer-level substrate 202, grinding/thinning the silicon substrate, forming one or more patterning structures (e.g., the via barrier 134), creating voids in the patterning structures and/or the device wafer, filling (via, e.g., metal deposition/plating) the voids with metallic material, and/or etching away protective or patterning layers.

Figure 3:
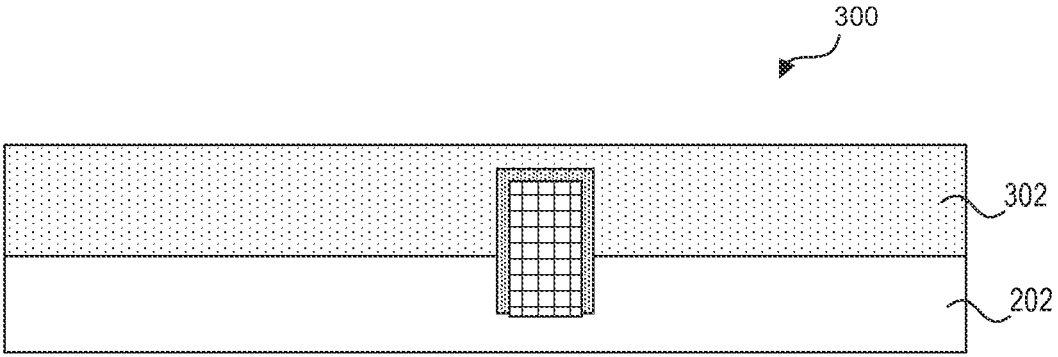

FIG. 3 illustrates an intermediate structure 300 having the structure 200 of FIG. 2 covered with an interfacing layer 302. The interfacing layer 302 can correspond to the interfacing segment 122 of FIG. 1A. For example, the interfacing layer 302 can include a dielectric layer, such as a SiN layer.

In some embodiments, the manufacturing process can include depositing the interfacing layer 302 onto the structure 200 (e.g., directly onto the uncovered surface 212 of FIG. 2). For example, the interfacing layer 302 can be deposited using a corresponding chemical deposition and/or lamination process. The interfacing layer 302 can have a thickness greater than a protrusion height of the TSV structure 204. The interfacing layer 302 can surround and/or conform to the TSV structure 204 protruding above the wafer-level substrate 202. The interfacing layer 302 may be applied with a thickness that covers a top portion of the TSV structure 204. The interfacing layer 302 may be planarized.

Figure 4:
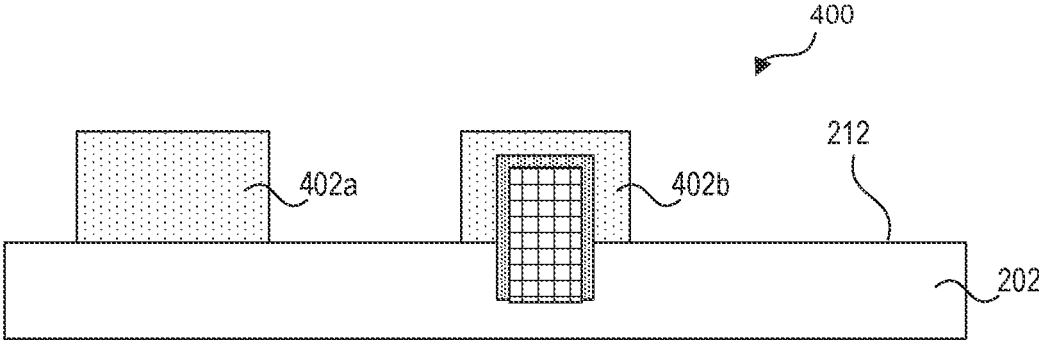

FIG. 4 illustrates an intermediate structure 400 having the structure 300 of FIG. 3 with one or more segment structures (e.g., segment structures 402a and 402b) on the uncovered surface 212. The structure 400 can be formed by etching away portions of the interfacing layer 302 except for the segment structures. The segment structures can correspond to the interfacing segments 122 of FIG. 1A.

In some embodiments, one or more of the structures (e.g., the segment structure 402a) can be solid/continuous blocks of the interfacing material (e.g., SiN). Also, one or more of the structures (e.g., the segment structure 402b) can encompass or encapsulate the TSV structure 204 protruding above the wafer-level substrate 202. For example, the interfacing material can directly contact top and/or peripheral surfaces of the TSV structure 204 (e.g., the via barrier 134 of FIG. 1B).

Figure 5:
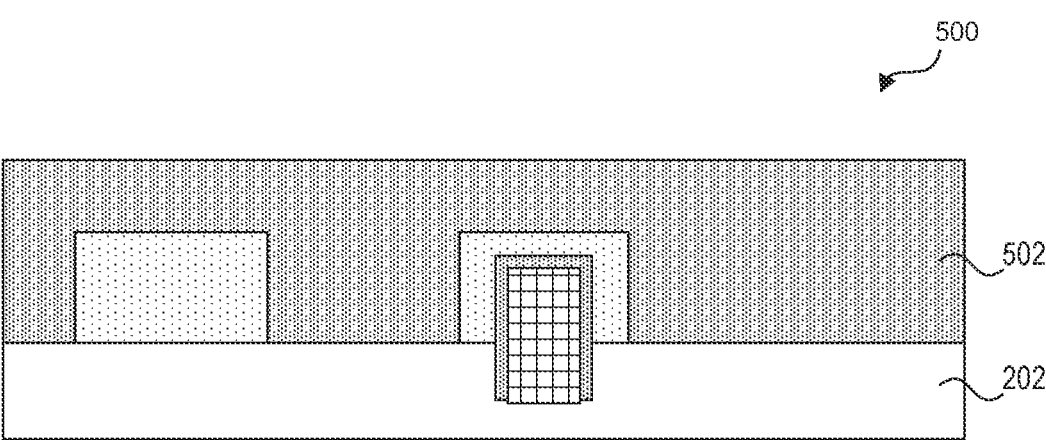

FIG. 5 illustrates an intermediate structure 500 having the structure 400 of FIG. 4 covered with a passivation structure 502 (e.g., TEOS layer). For example, TEOS may be deposited over the uncovered surface 212 of FIG. 4 and/or the segment structures (e.g., segment structures 402a and 402b) of FIG. 4. The deposited passivation structure 502 can have a thickness greater than the segment structures. Accordingly, the passivation structure 502 can cover the top portions of the segment structures and/or encompass and directly contact the segment structures.

In some embodiments, the TSV structure 204 of FIG. 2 may be left exposed (e.g., uncovered by the segment structure) in structure 400. Accordingly, the passivation structure 502 can directly contact and encapsulate the TSV structure 204. Peripheral portions of the subsequently attached electrical pad 106 of FIG. 1A may directly contact the passivation layer 116 of FIG. 1B instead of the interfacing segment 122 of FIG. 1A.

Figure 6:
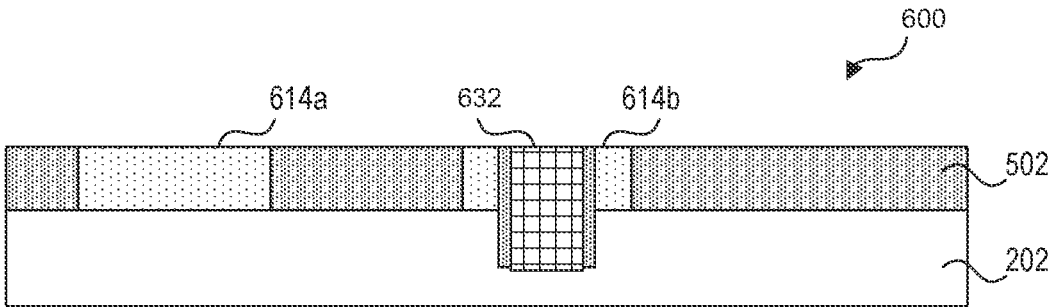

FIG. 6 can illustrate an intermediate structure 600 corresponding to the structure 500 of FIG. 5 with a top portion thereof removed. For example, the manufacturing process can include chemical and/or mechanical removal processes (e.g., cutting, grinding, chemical-mechanical polishing (CMP), etc.) to remove a portion of the passivation structure 502, a portion of each segment structure, a portion of the TSV structure 204 of FIG. 2, or a combination thereof. The remaining portion of the passivation structure 502 can correspond to the passivation layer 116 of FIG. 1B, the remaining portions of the segment structures can correspond to the interfacing segments 122 of FIG. 1A, and/or the remaining portions of the TSV structure 204 can correspond to the TSV 132 of FIG. 1B and/or the via barrier 134 of FIG. 1B. Further, the remaining portions can be coplanar. In other words, the removal process can form or expose one or more segment structure surfaces (e.g., surfaces 614a and 614b) and/or one or more TSV surfaces 632 that are coplanar to a top surface of the passivation structure 502.

Figure 7:
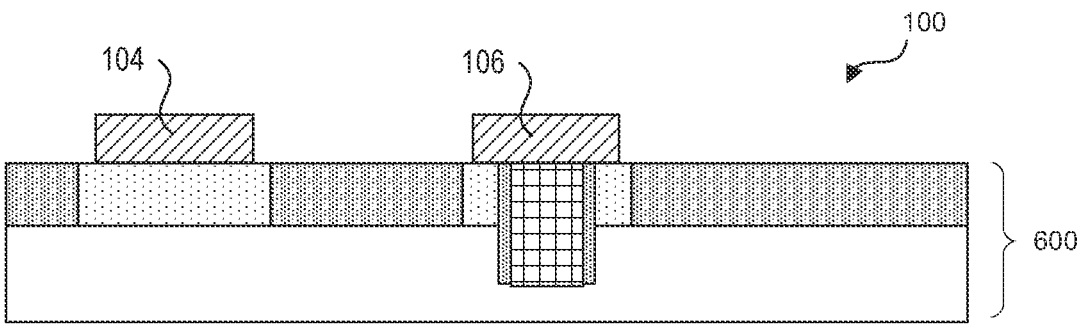

FIG. 7 can illustrate the intermediate structure 600 with the set of pads (UBM) mounted/attached thereon. The set of pads (e.g., the thermal pad 104 and/or the electrical pad 106) may be mounted over the segment structure surfaces (e.g., surfaces 614a and/or 614b) of FIG. 6 and/or the TSV surfaces 632 of FIG. 6. The pads may be mounted based on bonding and/or attaching (via, e.g., adhesives) the set of pads to the corresponding segment structure surfaces and/or the TSV surfaces 632. The apparatus 100 of FIG. 1A may be formed based on mounting the set of pads to the intermediate structure 600.

In some embodiments, the segment structure surfaces may be exposed without any connection pads attached thereto. The corresponding interfacing segments 122 can be used to address warpage and/or to adjust capacitances between structures within the apparatus 100.

Figure 8:
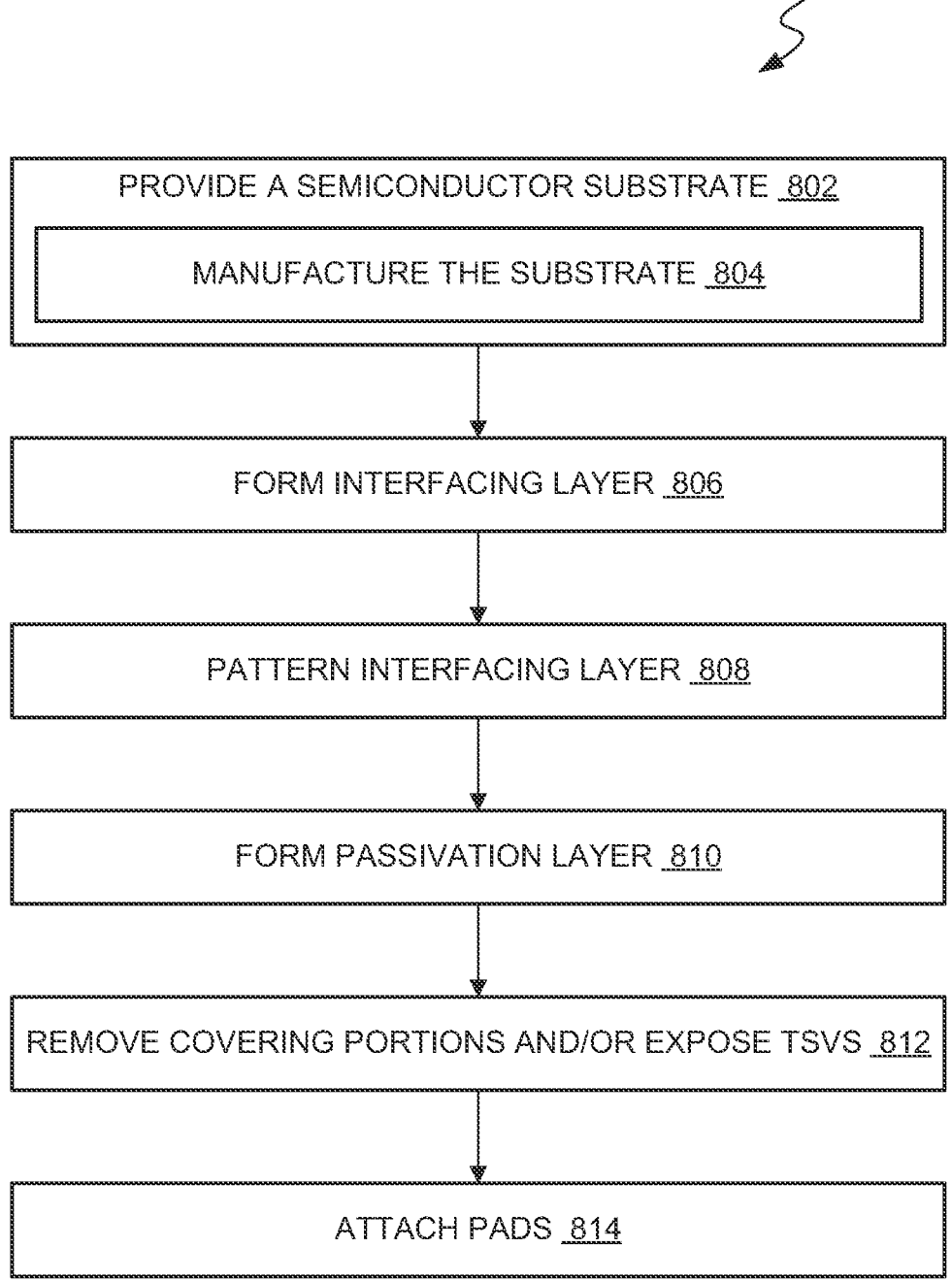
FIG. 8 is a flow diagram illustrating an example method of manufacturing an apparatus in accordance with an embodiment of the present technology.

FIG. 8 is a flow diagram illustrating an example method 800 of manufacturing an apparatus (e.g., the apparatus 100 of FIG. 1A) in accordance with an embodiment of the present technology. The method 800 can include forming the interfacing segments 122 of FIG. 1A.

At block 802, the method 800 can include providing a semiconductor substrate (e.g., the substrate 112 of FIG. 1B, such as the wafer-level substrate 202 of FIG. 2). The substrate 112 can correspond to a process associated with FIG. 2 and the structure 200 of FIG. 2. The provided substrate may include the TSV structure 204 of FIG. 2 as described above. In some embodiments, providing the substrate 112 may include manufacturing the wafer-level substrate 202 as illustrated at block 804, such as through semiconductor manufacturing processes (e.g., doping, thinning, or the like).

At block 806, the method 800 can include forming an interfacing layer. For example, forming the interfacing layer can include depositing and/or laminating dielectric or barrier material, such as SiN over the substrate 112 of FIG. 1B (e.g., the wafer-level substrate 202 of FIG. 2 and/or the uncovered surface 212 of FIG. 2). The interfacing layer may be formed directly contacting and/or surrounding or encapsulating the TSV structure 204 of FIG. 2. Forming the protective layers can correspond to the processes associated with FIG. 3 and the structure 300 of FIG. 3.

At block 808, the method 800 can include patterning the interfacing layer to form the interfacing pockets. Patterning the interfacing layer can include removing portions of the interfacing layer, such as by a cutting process, a grinding process, an etching process, a CMP process, or the like. Patterning the interfacing layer can correspond to the processes associated with FIG. 4 and the structure 400 of FIG. 4. For example, removal of the portions of the interfacing layer can correspond to forming the interfacing pockets (e.g., the segment structures 402a and 402b of FIG. 4). In some embodiments, one or more of the interfacing pockets can have the TSV structure 204 of FIG. 2 encapsulated therein.

At block 810, the method 800 can include forming a passivation layer. Forming the passivation layer can include depositing and/or laminating an outer protective layer (e.g., a TEOS layer). The passivation layer can be formed around and/or directly contacting the wafer-level substrate 202 and/or the interfacing pockets. For example, the passivation layer can be formed adjacent to, over, and/or directly contacting external portions of the segment structures (e.g., segment structures 402a and 402b). The passivation layer can also be formed over and/or directly contacting the uncovered surface 212 of the wafer-level substrate 202 after patterning of the segment structures. Forming the passivation layer can correspond to the processes associated with FIG. 5 and the structure 500 of FIG. 5.

At block 812, the method 800 can include removing covering portions (e.g., top portions) of the passivation layer and/or the interfacing pockets. Removing the covering portions can include exposing the TSV structure (e.g., the vertically extending metal/conductive material). Portions of the passivation layer, the interfacing pockets, and/or the TSV structure may be removed based on etching, grinding, CMP, etc. The removal process can further correspond to a planarization process that forms coplanar surfaces of the TSV structure, the interfacing pockets, and/or the passivation layer. Removing the covering portions can correspond to the processes associated with FIG. 6 and the structure 600 of FIG. 6.

At block 814, the method 800 can include attaching the connection pads (e.g., UBMs), such as the electrical pads 106 of FIG. 1A and/or the thermal pads 104 of FIG. 1A. The connection pads may be attached to/over the planarized surface (e.g., the surface 102 of FIG. 1A) resulting from removing the covering portions. The thermal pads 104 can be attached to the remaining interfacing pockets (e.g., the interfacing segments 122). The electrical pads 106 can be coupled (e.g., electrically coupled) or directly attached to the TSV structures 204 (e.g., the TSVs 132) and/or the corresponding interfacing segments 122.

The interfacing segments 122 can provide decrease in warpage of the apparatus 100. Given the difference in material, the interfacing segments 122 may be formed between portions of the passivation layer 116 to provide different temperature-related changes (e.g., expansions) than the passivation layer 116. Accordingly, the warpage of the apparatus 100 during other temperature-changing manufacturing processes (e.g., reflow) may be controlled or reduced. Moreover, the interfacing segments 122 can provide increased structural integrity at or underneath the connection pads. For example, the interfacing segments 122 can include material (e.g., SiN) having greater stiffness and/or greater flexibility under various conditions than the passivation layer 116. Accordingly, physically coupling the connection pads to the interfacing segments 122 instead of the passivation layer 116 can reduce structural damage (e.g., cracks) forming underneath the connection pads. Further, the interfacing segments 122 can be formed by leveraging existing processes (e.g., without increasing manufacturing complexities) without negatively impacting the solder joint interconnect.

Figure 9:
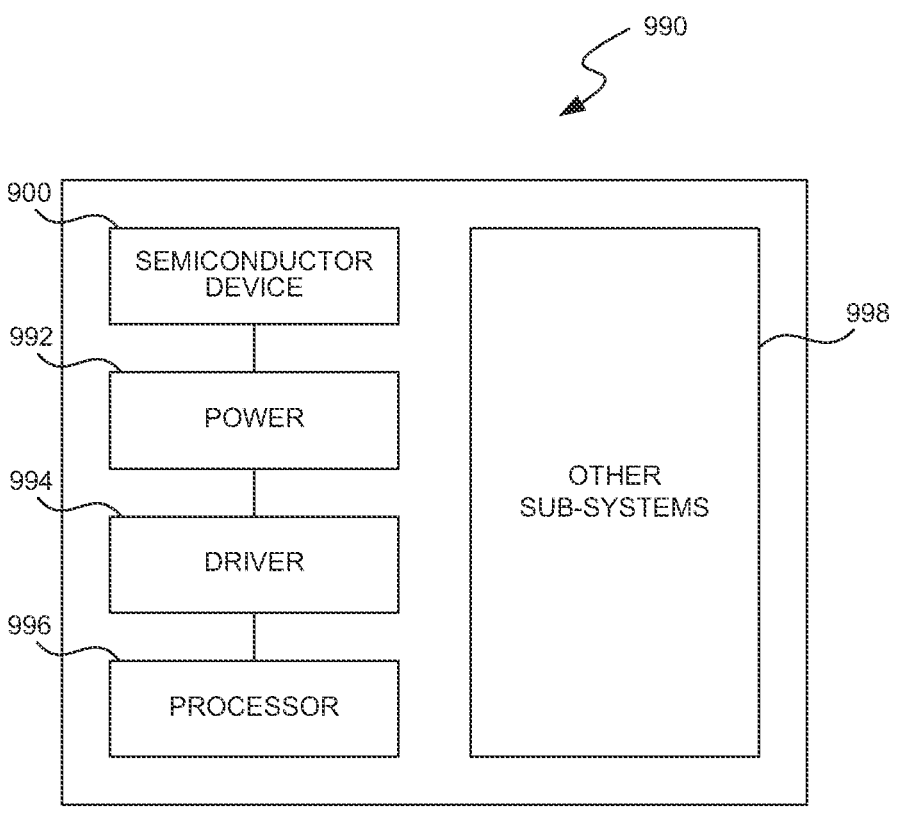
FIG. 9 is a schematic view of a system that includes an apparatus configured in accordance with embodiments of the present technology.

FIG. 9 is a schematic view of a system that includes an apparatus in accordance with embodiments of the present technology. Any one of the semiconductor devices described above with reference to FIGS. 1A-8 can be incorporated into any of a myriad of larger and/or more complex systems, a representative example of which is system 990 shown schematically in FIG. 9. The system 990 can include a semiconductor device 900 ("device 900") (e.g., a semiconductor device, package, and/or assembly), a power source 992, a driver 994, a processor 996, and/or other subsystems or components 998. The device 900 can include features generally similar to those devices described above. The resulting system 990 can perform any of a wide variety of functions, such as memory storage, data processing, and/or other suitable functions. Accordingly, representative systems 990 can include, without limitation, handheld devices (e.g., mobile phones, tablets, digital readers, and digital audio players), computers, and appliances. Components of the system 990 may be housed in a single unit or distributed over multiple, interconnected units (e.g., through a communications network). The components of the system 990 can also include remote devices and any of a wide variety of computer-readable media.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. In some cases, well-known structures and functions have not been shown or described in detail to avoid unnecessarily obscuring the description of the embodiments of the present technology. Although steps of methods may be presented herein in a particular order, alternative embodiments may perform the steps in a different order. Similarly, certain aspects of the present technology disclosed in the context of particular embodiments can be combined or eliminated in other embodiments. Furthermore, while advantages associated with certain embodiments of the present technology may have been disclosed in the context of those embodiments, other embodiments can also exhibit such advantages, and not all embodiments need necessarily exhibit such advantages or other advantages disclosed herein to fall within the scope of the technology. Accordingly, the disclosure and associated technology can encompass other embodiments not expressly shown or described herein, and the invention is not limited except as by the appended claims.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the terms "comprising," "including," and "having" are used throughout to mean including at least the recited feature(s) such that any greater number of the same feature and/or additional types of other features are not precluded. Reference herein to "one embodiment," "an embodiment," "some embodiments," or similar formulations means that a particular feature, structure, operation, or characteristic described in connection with the embodiment can be included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

What is claimed is:

1. An apparatus, comprising:
a substrate;
a protection layer over a surface of the substrate; and
an interfacing segment patterned within the protection layer, wherein:
the interfacing segment has a bottom surface that is above the substrate,
the interfacing segment and the protection layer include different material, and
the interfacing segment and the protection layer are coplanar with each other.

2. The apparatus of claim 1, wherein the substrate is a semiconductor substrate.

3. The apparatus of claim 1, wherein the interfacing segment includes electrically insulative material.

4. The apparatus of claim 1, further comprising:
a connection pad directly coupled to the interfacing segment, the connection pad configured to interface with a structure external to the apparatus.

5. The apparatus of claim 4, wherein:
the connection pad has a pad width measured along a lateral direction; and
the interfacing segment has an interfacing width along the lateral direction, wherein the interfacing width is greater than the pad width.

6. The apparatus of claim 5, wherein one or more peripheral portions of the interfacing segment laterally extend past one or more corresponding lateral edges of the connection pad.

7. The apparatus of claim 4, wherein:
the interfacing segment includes electrically insulative material; and the connection pad is a thermal pad electrically isolated from active circuits on the apparatus and configured to remove thermal energy away from the apparatus.

8. The apparatus of claim 7, wherein the thermal pad includes a bottom surface extending between peripheral edges and directly attached to the interfacing segment without overlapping the protection layer.

9. The apparatus of claim 4, wherein the connection pad is an active pad electrically coupled to one or more circuits on the apparatus.

10. The apparatus of claim 9, further comprising:
a through-silicon via (TSV) at least partially extending along a vertical direction and through a portion of the substrate, the TSV configured to electrically couple the active pad to the one or more circuits on the substrate.

11. The apparatus of claim 10, wherein a portion of the TSV between the active pad and the substrate is surrounded by the interfacing segment.

12. The apparatus of claim 11, wherein the interfacing segment and the protection layer have matching thicknesses.

13. The apparatus of claim 1, wherein the interfacing segment has an exposed surface extending between peripheral edges of the interfacing segment.

14. A device, comprising:
a substrate;
active circuitry formed on the substrate;
a protection layer over a surface of the substrate; and
an interfacing segment patterned within the protection layer, wherein:
the interfacing segment has a bottom surface that is above the substrate,
the interfacing segment and the protection layer include different material, and
the interfacing segment and the protection layer are coplanar with each other;
an electrical pad physically coupled to the substrate and electrically coupled to the active circuitry; and
a thermal pad physically coupled to the interfacing segment and electrically isolated from the active circuitry, wherein the thermal pad is configured to provide an external thermal interface for removing thermal energy from the device.

15. The device of claim 14, wherein peripheral portions of the interfacing segment laterally extend past peripheral edges of the thermal pad.

16. The device of claim 14, wherein the thermal pad is directly attached to the interfacing segment without contacting the protection layer.

17. The device of claim 16, wherein:
the protection layer includes a tetraethyl orthosilicate (TEOS) layer; and
the interfacing segment includes silicon nitride (SiN).

18. The device of claim 17, wherein:
the interfacing segment is a first SiN segment;
further comprising:
a through-silicon via (TSV) electrically coupled to the electrical pad and/or the active circuitry, the TSV having a TSV length that is greater than a length of an extension of the interfacing segment; and
a second SiN segment embedded within the protection layer and surrounding peripheral portions of the TSV, wherein the electrical pad is directly attached to the second SiN.

19. A system, comprising:

an external device coupled to an external electrical inter-
face; and an assembly comprising:

a substrate;

active circuitry formed on the substrate, the active
circuitry coupled to the external electrical interface;

a protection layer over a surface of the substrate; and an interfacing segment patterned within the protection
layer, wherein:

the interfacing segment has a bottom surface that is
above the substrate, the interfacing segment and the protection layer
include different material, and the interfacing segment and the protection layer are
coplanar with each other; and an electrical pad physically coupled to the substrate and
electrically coupled to the active circuitry, wherein
the electrical pad is configured to provide the exter-
nal electrical interface between the active circuitry
and the external device.

20. The system of claim 19, wherein:

the protection layer includes a tetraethyl orthosilicate
(TEOS) layer; and the interfacing segment includes silicon nitride (SiN).

\* \* \* \* \*